United States Patent
Kim et al.

(10) Patent No.: US 7,352,623 B2
(45) Date of Patent: Apr. 1, 2008

(54) NOR FLASH MEMORY DEVICE WITH MULTI LEVEL CELL AND READ METHOD THEREOF

(75) Inventors: Bo-Geun Kim, Gyeonggi-do (KR); Heung-Soo Lim, Gyeonggi-do (KR); Jae-Woo Lim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/322,910

(22) Filed: Dec. 29, 2005

(65) Prior Publication Data

US 2007/0002628 A1 Jan. 4, 2007

(30) Foreign Application Priority Data

Jul. 4, 2005 (KR) ...................... 10-2005-0059781

(51) Int. Cl.
*G11C 11/34* (2006.01)
(52) U.S. Cl. .............................. 365/185.17; 365/185.33
(58) Field of Classification Search ........... 365/185.17, 365/185.33
See application file for complete search history.

(56) References Cited

U.S. PATENT DOCUMENTS

| 5,684,736 | A | * | 11/1997 | Chan ........................... 365/149 |
| 6,097,635 | A | | 8/2000 | Chang |
| 6,370,081 | B1 | * | 4/2002 | Sakui et al. ............. 365/238.5 |
| 6,836,431 | B2 | | 12/2004 | Chang |
| 2003/0094648 | A1 | | 5/2003 | Otani et al. |
| 2004/0174741 | A1 | * | 9/2004 | Tanaka ................... 365/185.08 |
| 2005/0286285 | A1 | * | 12/2005 | Lee et al. ...................... 365/63 |
| 2006/0215453 | A1 | * | 9/2006 | Seong ................... 365/185.12 |

FOREIGN PATENT DOCUMENTS

| JP | 07-037393 | 2/1995 |
| JP | 2003-022683 | 1/2003 |
| KR | 2000-0061557 | 10/2000 |
| KR | 2003-0002730 | 1/2003 |

OTHER PUBLICATIONS

English language abstract of Korean Publication No. 2000-0061557.
English language abstract of Koran Publication No. 2003-0002730.
English language abstract of Japanese Publication No. 07-037393.
English language abstract of Japanese Publication No. 2003-022683.

* cited by examiner

*Primary Examiner*—Michael T Tran
(74) *Attorney, Agent, or Firm*—Marger Johnson & McCollom, P.C.

(57) ABSTRACT

A NOR flash memory device includes a multi level memory cell coupled to a bit line configured to be sensed in response to a word line voltage, and a discharge circuit configured to discharge the bit line when the multi level memory cell is sensed as an on cell.

23 Claims, 6 Drawing Sheets

NOR FLASH MEMORY DEVICE WITH MULTI LEVEL CELL AND READ METHOD THEREOF

CROSS-REFERENCE TO RELATED APPLICATIONS

This U.S. non-provisional patent application claims priority under 35 U.S.C. § 119 of Korean Patent Application 2005-59781 filed on 4 Jul. 2005, the entire contents of which are hereby incorporated by reference.

BACKGROUND OF THE INVENTION

1. Field of the Invention

This disclosure relates to a nonvolatile memory device, and more particularly, to a NOR flash memory device with multi level cell and a read method thereof.

2. Description of the Related Art

A nonvolatile memory device can retain data stored in memory cells even when power is removed. Examples of the nonvolatile memory device are programmable read only memory (PROM), erasable PROM (EPROM), electrically eraseble EPROM (EEPROM), flash memory, and so on. The flash memory devices are classified into NAND flash memory device and NOR flash memory device. Because the NOR flash memory device has higher speed than the NAND flash memory, it is widely used in mobile terminals that necessarily require high-speed data processing.

The NOR flash memory device includes memory cells connected between bit lines and source lines. Memory cells connected to one word line are commonly connected to one source line.

Each of the memory cells is sensed as an on cell or an off cell according to a word line voltage. The on cell means that the memory cell is in a turned-on state because a word line voltage is higher than a threshold voltage. In this state, more than a predetermined amount of a current flows through the memory device. The off cell means that the memory cell is in a turned-off state because a word line voltage is lower than a threshold voltage. In this state, no current or less than a predetermined amount of a current flows through the memory device.

Generally, it is preferable that a semiconductor memory device has a large storage capacity in a small area. In order for the NOR flash memory to have a large storage capacity in a small area, the degree of integration has to be increased. The existing semiconductor fabrication technologies, however, have a limitation in increasing the degree of integration. Hence, methods of increasing the storage capacity in the same degree of integration have been developed.

One of these methods is to store multi-bit data in one memory cell. A memory cell that can store multi-bit data is called a multi level cell (MLC) or multi-bit cell. For example, an MLC may have four states "11", "10", "01" and "00" depending on its threshold voltages. Because the MLC can store 2-bit data in one memory cell, it has two times the storage capacity of a single level cell (SLC).

There are several methods of reading the states of the MLC. One of these methods is to read the states of the memory cell while increasing a word line voltage. For example, if the memory cell is an on cell for the first word line voltage WL_L, the memory cell is in a state "11". If the memory cell is an off cell for the first word line voltage WL_L and an on cell for the second word line voltage WL_M, the memory cell is in a state "10". If the memory cell is an off cell for the second word line voltage WL_M and an on cell for the third word line voltage WL_H higher than the second word line voltage WL_M, the memory cell is in a state "01". If the memory cell is an off cell for the third word line voltage WL_H, the memory cell is in a state "00".

During a read operation performed on the memory cell while increasing the word line voltage, the memory cell sensed once as the on cell is again sensed as the on cell even though the word line voltage increases. For example, after the first word line voltage WL_L is applied to the memory cell, if the sensing result is that the memory cell is the on cell, the memory cell is again sensed as the on cell when the second or third word line voltage WL_M or WL_H is applied. Accordingly, once the memory cell is sensed as the on cell in the first sensing operation, the second or third sensing operation is unnecessary.

In the case of the conventional NOR flash memory device, however, if the memory cell is determined as the on cell in the first sensing operation, a current flows through the memory cell in the second or third sensing operation, resulting in the unnecessary current consumption. In addition, because a current flows through the memory cell in the second or third sensing operation, a voltage level of the source line increases so that the second or third operation may be unstable. That is, although the memory cell of a state "10" has to be sensed as the on cell in the second sensing operation, the memory cell may be sensed as the off cell because the source line voltage increases from the additional current.

SUMMARY OF THE INVENTION

An embodiment includes a NOR flash memory device including a multi level memory cell coupled to a bit line configured to be sensed in response to a word line voltage, and a discharge circuit configured to discharge the bit line when the multi level memory cell is sensed as an on cell.

Another embodiment includes a method of reading a NOR flash memory device including sensing a multi level memory cell coupled to a bit line in response to a first of several word line voltages, discharging the bit line if the multi level memory cell is sensed as a first state, and continuing sensing the multi level memory cell if the multi level memory cell is sensed in a second state.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Reference will now be made in detail to preferred embodiments, examples of which are illustrated in the accompanying drawings. However, the present invention is not limited to the embodiments illustrated herein after, and the embodiments herein are rather introduced to provide easy and complete understanding of the scope and spirit of the present invention.

Figure 1:
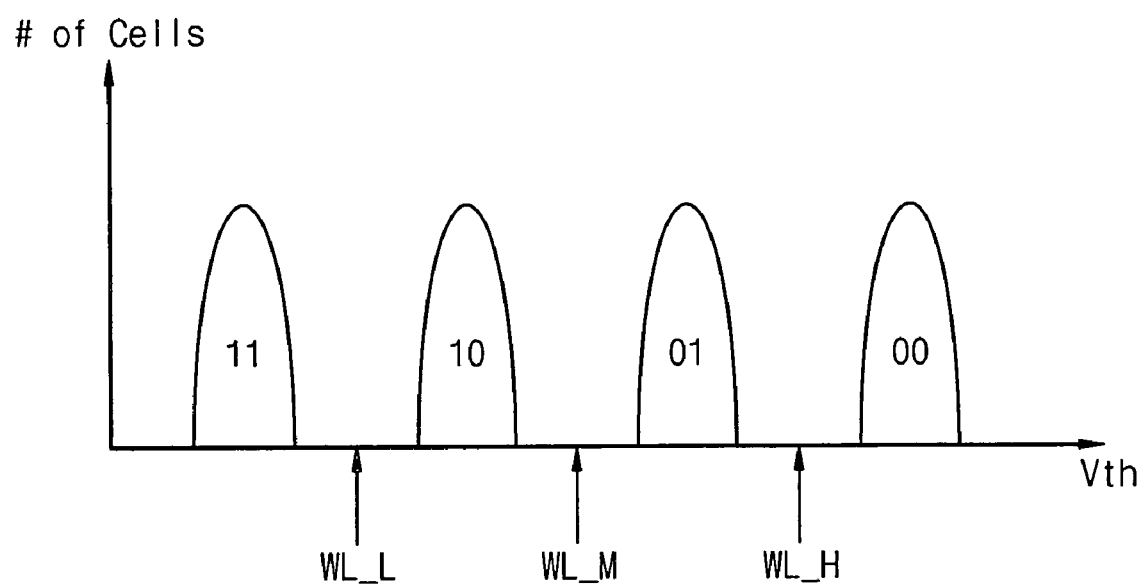
FIG. 1 illustrates a distribution of memory cells according to threshold voltage (Vt)

FIG. 1 illustrates a distribution of memory cells according to threshold voltage (Vt). Referring to FIG. 1, the memory cell has one of four states "11", "10", "01" and "00" according to threshold voltage. In FIG. 1, the states of the memory cell are read while increasing a word line voltage.

When a first word line voltage WL_L is applied, if the memory cell is sensed as an on cell, it is in a state "11" because the first word line voltage WL_L is higher than a threshold voltage Vt of the memory cell. In the same manner, if the memory cell is an off cell for the first word line voltage WL_L and an on cell for the second word line voltage WL_M, the memory cell is in a state "10". If the memory cell is an off cell for the second word line voltage WL_M and an on cell for the third word line voltage WL_H, the memory cell is in a state "01". If the memory cell is an off cell for the third word line voltage WL_H, the memory cell is in a state "00".

During a read operation performed on the memory cell while increasing the word line voltage, the memory cell sensed as the on cell is again sensed as the on cell as the word line voltage increases. For example, if the memory cell is sensed as the on cell with respect to the first word line WL_L, the memory cell is again sensed as the on cell with respect to the second or third word line voltage WL_M or WL_H.

Figure 2:
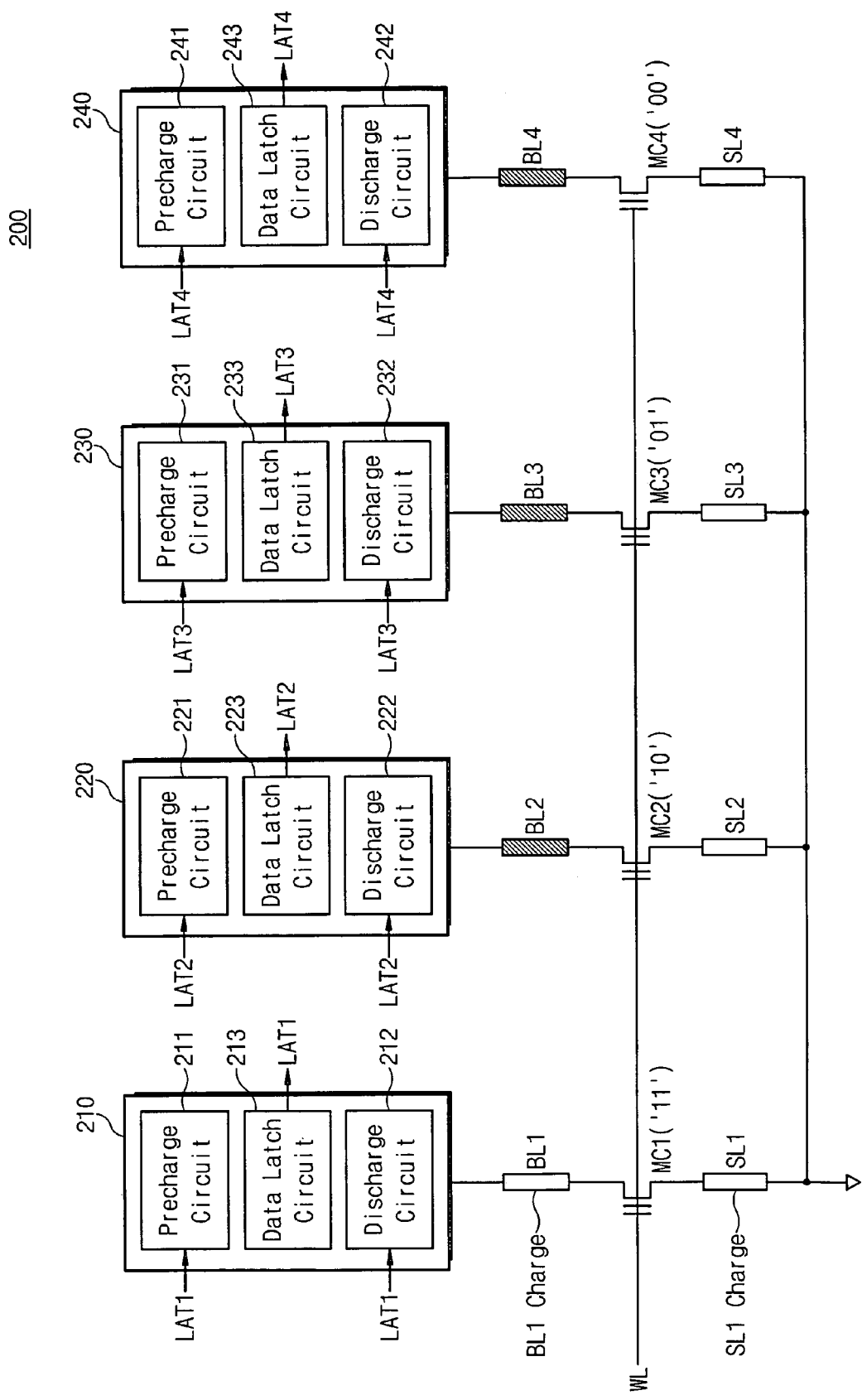
FIG. 2 is a block diagram of a NOR flash memory device according to an embodiment.

FIG. 2 is a block diagram of a NOR flash memory device according to an embodiment. Referring to FIG. 2, the NOR flash memory device 200 includes memory cells MC1 to MC4 and data output circuits 210, 220, 230 and 240. The memory cells MC1 to MC4 and the data output circuits 210, 220, 230 and 240 are connected through bit lines BL1 to BL4. The memory cells MC1 to MC4 are connected to a ground terminal through source lines SL1 to SL4. The source lines SL1 to SL4 are shared with one another.

In FIG. 2, boxes in the bit lines BL1 to BL4 and the source lines SL1 to SL4 represent a precharge or discharge state of charge. A blank box and a hatched box represent a discharge state and a precharge state, respectively. That is, the first bit line BL1 is in a discharge state, and the second to fourth bit lines BL2 to BL4 are in a precharge state. All of the source lines SL1 to SL4 are in a discharge state.

Referring to FIG. 2, a first memory cell MC1, a second memory cell MC2, a third memory cell MC3, and a fourth memory cell MC4 are in a state "11", a state "10", a state "01" and a state "00", respectively. A first word line voltage WL_L is applied to a word line WL. As described with reference to FIG. 1, when the first word line voltage WL_L is applied to the memory cells MC1 to MC4, the first memory cell MC1 is sensed as the on cell, and the second to fourth memory cells MC2 to MC4 are sensed as the off cell.

Each of the data output circuits 210, 220, 230 and 240 includes a precharge circuit, a discharge circuit, and a data latch circuit. The precharge circuit is a circuit for precharging the bit line, and the discharge circuit is a circuit for discharging the bit line. If the memory cell is sensed as the on cell when the read operation is performed according to the voltage level of the word line, the data latch circuits supply latch control signals LAT1 to LAT4 to the corresponding precharge circuits and the corresponding discharge circuits. The precharge circuits are controlled to cut off a power supply to the bit lines, and the discharge circuits are controlled to discharge charges of the bit lines.

The reason why the first bit line BL1 is in the discharge state in FIG. 1 will be described below. If the read operation is performed according to the first word line voltage WL_L, the first memory cell MC1 is sensed as the on cell. In this case, the data latch circuit supplies the first latch control signal LAT1 to the precharge circuit 211 and the discharge circuit 212. The precharge circuit 211 cuts off a supply of the power supply voltage to the first bit line BL1 in response to the first latch control signal LAT1. The discharge circuit 212 discharges charges of the bit line BL1 in response to the first latch control signal LAT1. Accordingly, when the read operation is performed according to the first word line voltage WL_L, the first bit line BL1 is in the discharge state.

Figure 3:
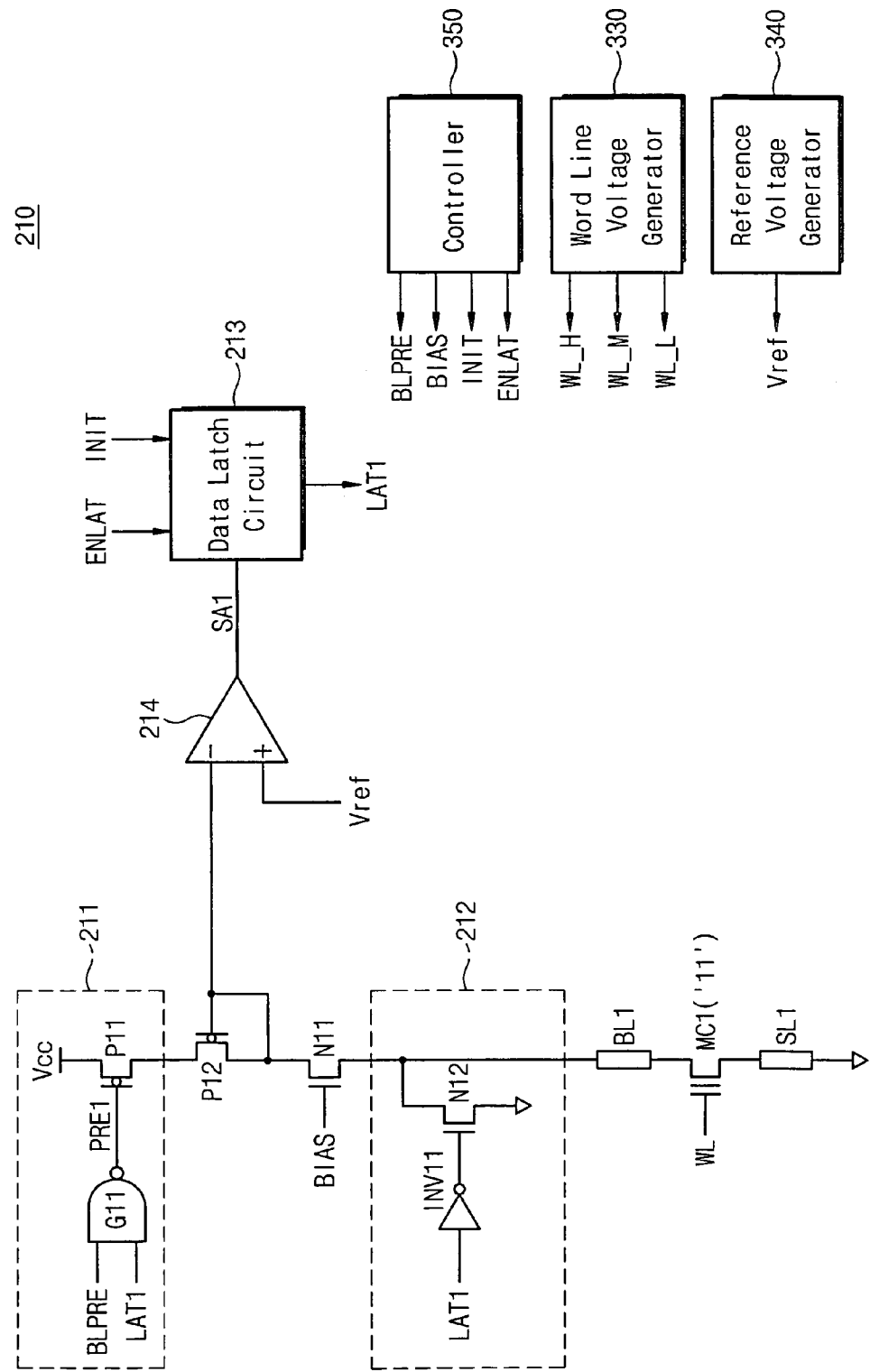
FIG. 3 is a circuit diagram of a data output circuit illustrated in FIG. 2.

FIG. 3 is a circuit diagram of the data output circuit illustrated in FIG. 2. Each of the data output circuits illustrated in FIG. 2 has the same configuration and operation principle. Accordingly, a following description will be made only about the data output circuit 210 connected to the first memory cell MC1.

Referring to FIG. 3, the data output circuit 210 includes the precharge circuit 211, the discharge circuit 212, and the data latch circuit 213. In addition, the data output circuit 210 includes a PMOS transistor P12, an MOS transistor N11, a sense amplifier 214, a word line voltage generator 330, a reference voltage generator 340, and a controller 350. Since the PMOS transistor P12, the NMOS transistor N11, the sense amplifier 214, the word line voltage generator 330, the reference voltage generator 340, and the controller 350 are well known to those skilled in the art, their detailed description will be omitted.

The precharge circuit 211 is coupled between a power supply voltage terminal and the first bit line BL1. The precharge circuit 211 supplies a power supply voltage Vcc to the first bit line BL1 in response to the first latch control signal LAT1 from the data latch circuit 213 and the bit line precharge signal BLPRE from the controller 350. As illustrated in FIG. 3, the precharge circuit 211 may be configured with a PMOS transistor P11 and a NAND gate G11. The NAND gate G11 receives the bit line precharge signal BLPRE and the first latch control signal LAT1 and outputs a first precharge signal PRE1 to the PMOS transistor P11.

The discharge circuit 212 is coupled between the first bit line BL1 and a ground terminal. The discharge circuit 212 discharges charges of the first bit line BL1 to the ground in response to the first latch control signal LAT1 supplied from the data latch circuit 213. As illustrated in FIG. 3, the discharge circuit 212 may be configured with an NMOS transistor N12 and an inverter INV11. The inverter INV11 inverts the first latch control signal LAT1 and outputs the inverted first latch control signal LAT1 to a gate of the NMOS transistor N12.

The data latch circuit 213 is coupled to an output terminal of the sense amplifier 214. The data latch circuit 213 operates in response to an initialization signal INIT and a latch enable signal ENLAT from the controller 350. An internal structure and operation of the data latch circuit 213 will be described below in detail with reference to FIG. 4.

Figure 4:
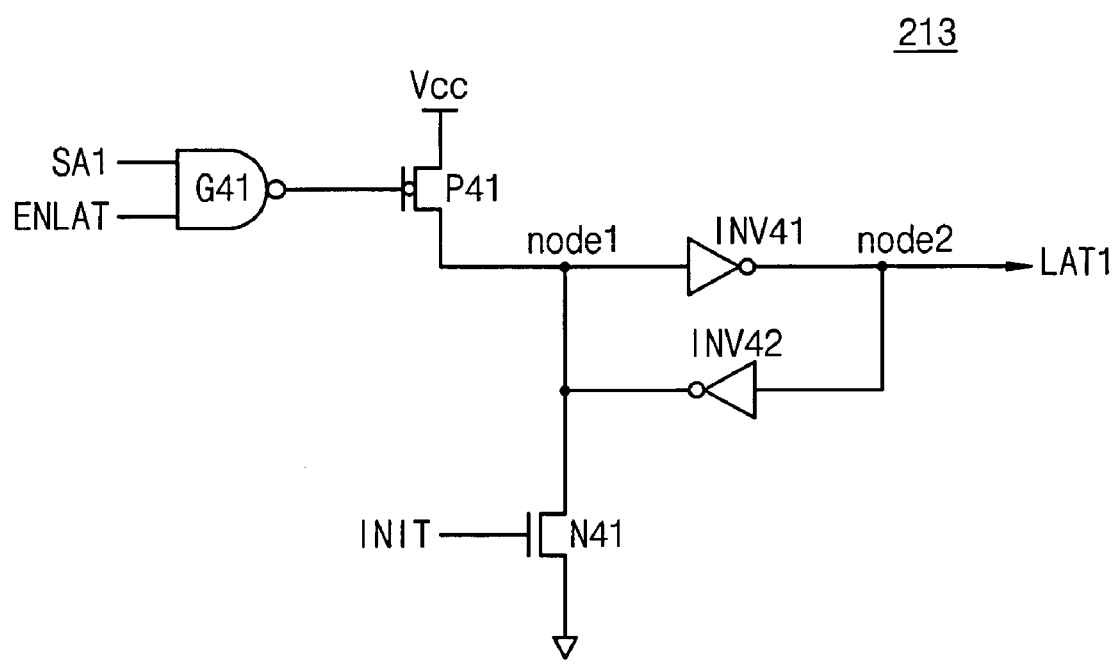
FIG. 4 is a circuit diagram of a data latch circuit illustrated in FIG. 2.

FIG. 4 is a circuit diagram of the data latch circuit illustrated in FIG. 3. Referring to FIG. 4, the data latch circuit 340 includes a latch coupled between a first node node1 and a second node node2. The latch includes two inverters INV41 and INV42. The first latch control signal LAT1 generated at the second node node2 is supplied to the precharge circuit (211 in FIG. 3) and the discharge circuit (212 in FIG. 3).

A reset circuit is coupled between the first node node1 and the ground terminal. The reset circuit initializes the first node node1 in response to the initialization signal INIT. The reset circuit may include an NMOS transistor N41.

A set circuit is coupled between the power supply voltage terminal and the first node node1. The set circuit supplies the power supply voltage Vcc to the first node node1 in response to the latch enable signal ENLAT and an output value SA1 of the sense amplifier 214. The set circuit may include a NAND gate G41 and a PMOS transistor P41. The NAND gate G41 receives the latch enable signal ENLAT and the output value SA1 of the sense amplifier 214 and outputs its result to a gate of the PMOS transistor P11.

Figure 5:
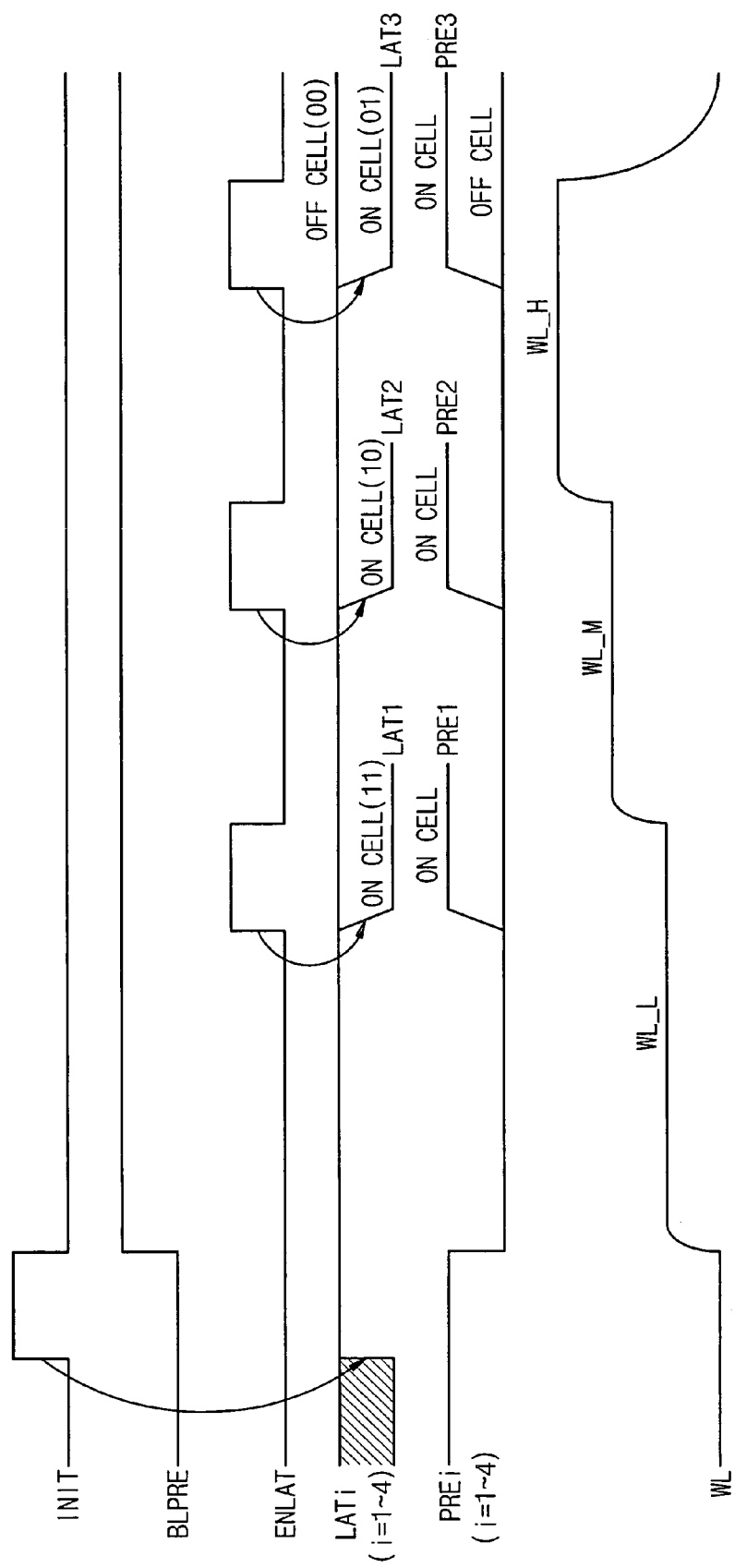
FIG. 5 is a timing diagram illustrating an operation of the NOR flash memory device illustrated in FIGS. 2 to 4.

FIG. 5 is a timing diagram illustrating an operation of the NOR flash memory device illustrated in FIGS. 2 to 4. Referring to FIG. 5, the first to third word line voltages WL_L, WL_M and WL_H that increase sequentially are applied to the word line WL. Hereinafter, a sensing operation according to the application of the first word line voltage WL_L, a sensing operation according to the application of the second word line voltage WL_M, and a sensing operation according to the application of the third word line voltage WL_H will be referred to as a first sensing operation, a second sensing operation, and a third sensing operation, respectively.

Prior to the first sensing operation, the initialization signal INIT is inputted to the data output circuits. In FIG. 4, when the initialization signal INIT is inputted to the data latch circuit 213, the first node node1 is grounded and the second node node2 is set to a high level. Accordingly, when the initialization signal INIT is inputted to the data output circuits, the latch control signals LAT1 to LAT4 are set to a high level.

When the latch control signals LAT1 to LAT4 are in the high level, the bit line precharge signal BLPRE is activated to a high level. Referring to FIG. 3, because the latch control signals LAT1 to LAT4 and the bit line precharge signal BLPRE are all in a high level, the precharge signals PRE1 to PRE4 are set to a low level. When the precharge signals PRE1 to PRE4 are set to a low level, the power supply voltage Vcc is supplied to the bit lines BL1 to BL4.

Next, the first word line voltage WL_L is applied and the first sensing operation is performed. At this point, because the first memory cell MC1 is the on cell, the output value SA1 of the first sense amplifier 214 has a high level. In addition, because the second to fourth memory cells MC2 to MC4 are the off cell, the output values SA2 to SA4 of the second to fourth sense amplifiers has a low level.

Then, the latch enable signal ENLAT and the data latch circuit 213 are inputted. Because both the output value SA1 of the first amplifier and the latch enable signal ENLAT are a high level, the PMOS transistor P41 has a low level. In FIG. 3, when the first latch control signal LAT1 has a low level, the first precharge signal PRE1 has a high level so that the first precharge circuit 211 cuts off a supply of the power supply voltage. The first discharge circuit 212 discharges charges of the first bit line BL1 through the NMOS transistor N12 to the ground. In contrast, because the second to fourth latch control signals LAT2 to LAT4 maintain a high level, the second to fourth precharge circuits 221, 231 and 241 continue to supply the power supply voltage to the second to fourth bit lines BL2 to BL4, respectively.

Next, the second word line voltage WL_M is applied and the second sensing operation is performed. In the sensing operation, because the second memory cell MC2 is the on cell, the output value SA2 of the second sensing amplifier 224 has a high level. When the latch enable signal ENLAT is inputted to the second data latch circuit 223, the second latch control signal LAT2 is set to a low level. When the second latch control signal LAT2 is set to a low level, the second precharge circuit 221 cuts off a supply of the power supply voltage. The second discharge circuit 222 discharges charges of the second bit lines BL2 to the ground.

Next, the third word line voltage WL_H is applied and the third sensing operation is performed. In the third sensing operation, because the third memory cell MC3 is the on cell, the output value SA3 of the third sense amplifier 234 has a high level. When the latch enable signal ENLAT is inputted to the third data latch circuit 233, the third latch control signal LAT3 is set to a low level. When the third latch control signal LAT3 is set to a low level, the third precharge circuit 231 cuts off a supply of the power supply voltage. The third discharge circuit 232 discharges charges of the third bit lines BL3 to the ground. Meanwhile, because the fourth memory cell MC4 is the off cell in the third sensing operation, the fourth latch control signal LAT4 maintains a high level.

Figure 6:
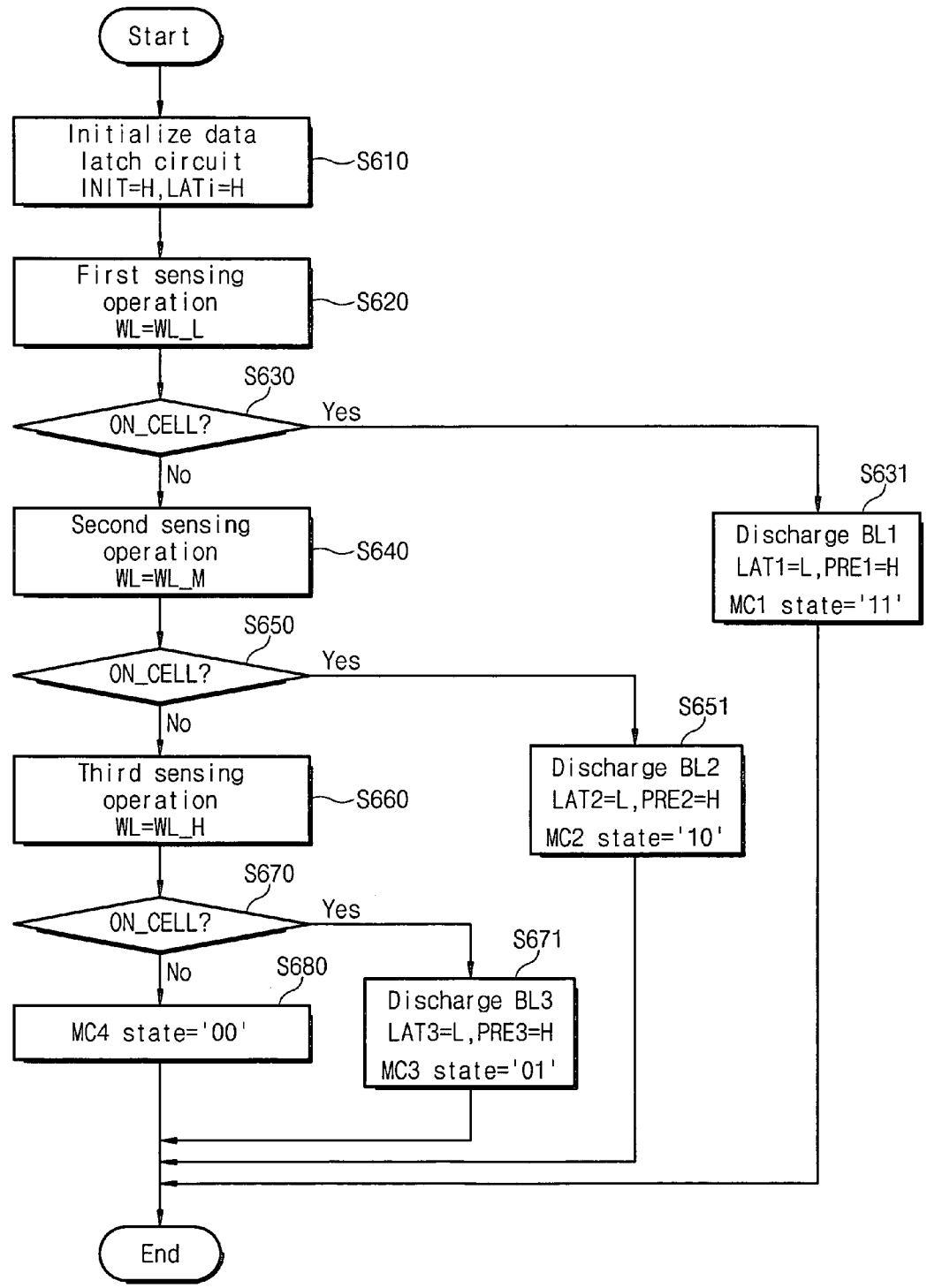
FIG. 6 is a flowchart illustrating a read method of the NOR flash memory device according an embodiment.

FIG. 6 is a flowchart illustrating a read method of the NOR flash memory device illustrated in FIGS. 2 to 4 according to an embodiment.

In S610, the data latch circuits are initialized. When the initialization signal INIT is inputted to the data output circuits 210, 220, 230 and 240, the latch control signals LAT1 to LAT4 are set to a high level.

In S620, the first sensing operation is performed. The first word line voltage WL_L is applied to the memory cells MC1 to MC4. The latch enable signal ENLAT is supplied to the data latch circuits 213, 223, 233 and 234.

In S630, it is determined whether or not the memory cells are the on cell. In the above example, the first memory cell MC1 will be determined as the on cell, and the second to fourth memory cells MC2 to MC4 will be determined as the off cell.

The process proceeds to S631 when the first memory cell MC1 is determined as the on cell. At this point, the first latch control signal LAT1 is set to a low level. In FIG. 3, when the first latch control signal LAT1 is set to a low level, the first precharge signal PRE1 is set to a high level, so that the first precharge circuit 211 cuts off a supply of the power supply voltage to the first bit line BL1. The first discharge circuit 212 discharges charges of the first bit line BL1 through the first discharge circuit 212 to the ground.

In S640, the second sensing operation is performed. The second word line voltage WL_M is supplied to the memory cells MC1 to MC4. The latch enable signal ENLAT is supplied to the data latch circuits 213, 223, 233 and 243.

In S650, it is determined whether or not the memory cells are the on cell. The second memory cell MC2 will be determined as the on cell, and the third and fourth memory cells MC3 and MC4 will be determined as the off cell.

The process proceeds to S631 when the second memory cell MC2 is determined as the on cell. At this point, the second latch control signal LAT2 is set to a low level. In FIG. 3, when the second latch control signal LAT2 is set to a low level, the second precharge signal PRE2 is set to a high level, so that the second precharge circuit 221 cuts off a supply of the power supply voltage to the second bit line BL2. The second discharge circuit 222 discharges charges of the second bit line BL2 through the second discharge circuit 222 to the ground.

In S660, the third sensing operation is performed. The third word line voltage WL_H is supplied to the memory cells MC1 to MC4. The latch enable signal ENLAT is supplied to the data latch circuits 213, 223, 233 and 243.

In S670, it is determined whether or not the memory cells are the on cell. The third memory cell MC3 will be determined as the on cell, and the fourth memory cell MC4 will be determined as the off cell.

The process proceeds to S671 when the third memory cell MC3 is determined as the on cell. At this point, the third latch control signal LAT3 is set to a low level. When the third latch control signal LAT3 is set to a low level, the third precharge signal PRE3 is set to a high level, so that the third precharge circuit 231 cuts off a supply of the power supply voltage to the third bit line BL3. The third discharge circuit 232 discharges charges of the third bit line BL3 through the third discharge circuit 232 to the ground. Finally, in S680, the state of the fourth memory cell MC4 is read.

In the NOR flash memory device and the read method thereof, the MLCs are sensed while increasing the word line voltage. In the first sensing operation, if the first memory cell is sensed as the on cell, the power supply voltage for the first bit line is cut off, thereby reducing the unnecessary current consumption. Also, in this case, because the charges of the first bit line are discharged by the discharge circuit, the problem of increasing the source line voltage does not occur. Accordingly, it is possible to prevent the memory cells from being incorrectly sensed due to the increase of the source line voltage in the second or subsequent sensing operations. Consequently, the unstable sensing operation due to the increased source line voltage can be prevented.

Although particular data stored in memory cells has been described and used in reference to an embodiment of a method, one of ordinary skill in the art will understand that any data may be stored in the memory cells. For example, all cells may contain the "01" state.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A NOR flash memory device comprising:
a multi level memory cell coupled to a bit line configured to be sensed in response to a word line voltage;
a discharge circuit configured to discharge the bit line when the multi level memory cell is sensed as an on cell, the discharge circuit including:
an inverter responsive to a latch control signal; and
a transistor coupled to the bit line and a ground and responsive to the output of the inverter; and
a data latch circuit configured to enable the discharge circuit when the multi level memory cell is sensed as the on cell.

2. The NOR flash memory device of claim 1, further comprising:
a precharge circuit configured to precharge the bit line and to discontinue precharging when the multi level memory cell is sensed as an on cell.

3. The NOR flash memory device of claim 2, wherein the precharge circuit is coupled to the bit line and a power supply.

4. The NOR flash memory device of claim 3, wherein the precharge circuit further comprises:
a NAND gate responsive to a bit line precharge signal and a latch control signal; and
a transistor coupled to the power supply and the bit line and responsive to the output of the NAND gate.

5. The NOR flash memory device of claim 2, wherein:
the data latch circuit is configured to disable the precharge circuit when the multi level memory cell is sensed as the on cell.

6. The NOR flash memory device of claim 2, wherein:
the data latch circuit is configured to enable the precharge circuit when the multi level memory cell is sensed as the off cell.

7. A method of reading a NOR flash memory device comprising:
sensing a multi level memory cell coupled to a bit line in response to a first of a plurality of word line voltages;
discharging the bit line if the multi level memory cell is sensed as a first state; and
continuing sensing the multi level memory cell if the multi level memory cell is sensed in a second state, including:
sensing the multi level memory cell in response to a second word line voltage;
discharging the bit line if the multi level memory cell is sensed as the first state; and
continuing sensing the multi level memory cell if the multi level memory cell is sensed in the second state.

8. The method of claim 7, wherein:
discharging the bit line further comprises discharging the bit line if the multi level memory cell is sensed as an on cell; and
continuing sensing the multi level memory cell further comprises continuing sensing the multi level memory cell if the multi level memory cell is sensed in as an off cell.

9. The method of claim 7, wherein continuing sensing the multi level memory cell further comprises:
sensing the multi level memory cell in response to a third word line voltage; and
discharging the bit line if the multi level memory cell is sensed as the first state.

10. The method of claim 7, further comprising precharging the bit line.

11. The method of claim 10, wherein discharging the bit line if the multi level memory cell is sensed as the first state further comprises discontinuing the precharging of the bit line if the multi level memory cell is sensed as the first state.

12. The method of claim 7, wherein continuing sensing the multi level memory cell further comprises:
sensing the multi level memory cell in response to each of the other word line voltages; and
discharging the bit line if the multi level memory cell is sensed as the first state through subsequent sensings using subsequent word line voltages.

13. A NOR flash memory device comprising:
a multi level memory cell coupled to a bit line configured to be sensed in response to a word line voltage;
a discharge circuit configured to discharge the bit line when the multi level memory cell is sensed as an on cell; and
a precharge circuit coupled to the bit line and a power supply, and configured to precharge the bit line and to discontinue precharging when the multi level memory cell is sensed as an on cell, the precharge circuit including:

a NAND gate responsive to a bit line precharge signal and a latch control signal; and a transistor coupled to the power supply and the bit line and responsive to the output of the NAND gate.

14. The NOR flash memory device of claim 13, further comprising:
a data latch circuit configured to disable the precharge circuit when the multi level memory cell is sensed as the on cell.

15. The NOR flash memory device of claim 13, further comprising:
a data latch circuit configured to enable the precharge circuit when the multi level memory cell is sensed as the off cell.

16. The NOR flash memory device of claim 13, further comprising:
a data latch circuit configured to enable the discharge circuit when the multi level memory cell is sensed as the on cell.

17. The NOR flash memory device of claim 16, wherein the discharge circuit further comprises:
an inverter responsive to a latch control signal; and
a transistor coupled to the bit line and the ground and responsive to the output of the inverter.

18. A method of reading a NOR flash memory device comprising:
sensing a multi level memory cell coupled to a bit line in response to a first of a plurality of word line voltages;
discharging the bit line if the multi level memory cell is sensed as a first state; and
continuing sensing the multi level memory cell if the multi level memory cell is sensed in a second state including:
sensing the multi level memory cell in response to each of the other word line voltages; and
discharging the bit line if the multi level memory cell is sensed as the first state through subsequent sensings using subsequent word line voltages.

19. The method of claim 18, wherein:
discharging the bit line further comprises discharging the bit line if the multi level memory cell is sensed as an on cell; and
continuing sensing the multi level memory cell further comprises continuing sensing the multi level memory cell if the multi level memory cell is sensed in as an off cell.

20. The method of claim 18, wherein continuing sensing the multi level memory cell further comprises:
sensing the multi level memory cell in response to a second word line voltage;
discharging the bit line if the multi level memory cell is sensed as the first state; and
continuing sensing the multi level memory cell if the multi level memory cell is sensed in the second state.

21. The method of claim 20, wherein continuing sensing the multi level memory cell further comprises:
sensing the multi level memory cell in response to a third word line voltage; and
discharging the bit line if the multi level memory cell is sensed as the first state.

22. The method of claim 18, further comprising precharging the bit line.

23. The method of claim 22, wherein discharging the bit line if the multi level memory cell is sensed as the first state further comprises discontinuing the precharging of the bit line if the multi level memory cell is sensed as the first state.

* * * * *